Dec. 12, 1967 R. Y. HUNG 3,358,154

HIGH SPEED, LOW DISSIPATION LOGIC GATES

Filed Oct. 29, 1964

INVENTOR
Roland Y. Hung
BY Sean Selron
ATTORNEY

United States Patent Office 3,358,154
Patented Dec. 12, 1967

3,358,154

HIGH SPEED, LOW DISSIPATION LOGIC GATES

Roland Y. Hung, Laurel, Md., assignor to Westinghouse Electric Corporation, Pittsburgh, Pa., a corporation of Pennsylvania Filed Oct. 29, 1964, Ser. No. 407,341
4 Claims. (Cl. 307—88.5)

ABSTRACT OF THE DISCLOSURE

A logic gate includes an input diode circuit for developing bivalued signals at a circuit point in response to bivalued input signals. A pair of transistors having their base electrodes commonly connected together turn on and off in response to the voltage at the circuit point. An output connection is made to an electrode of one transistor of the pair and a third transistor is provided and is responsive to the other transistor of the pair to provide a surge of current to the output during the transient period when switching of the first transistor occurs. A first current path is established for supplying a relatively low base current to the pair of transistors and a second current path is established for providing a relatively low collector current for the second transistor of the pair. The third transistor is located in a third current path which has a relatively low resistance for supplying a much higher current during the transient period when switching occurs.

This invention in general relates to semiconductor logic circuits and more particularly, to semiconductor logic circuits wherein fast switching speeds and low power dissipation is of prime importance in the design of the circuits.

Logic gates for use in digital systems are generally designed for receiving a plurality of input signals from previous stages for developing output signals in response to the input signals in order to drive one or more subsequent stages. The number of input signals received from previous stages is generally called the fan-in, a number of subsequent stages to be driven is termed the fan-out. The gating circuits operate in an on-off mode representing, for example, binary ONE and binary ZERO information.

A widely used type of logic circuit is the NAND gate which functions to receive input signals and provide a ONE output signal when one or more of the input signals is a ZERO, and provide a ZERO output signal only when all of the input signals are ONES. In the DTL (diode-transistor-logic) NAND gate the combination of input signals applied to the diodes determines the conduction or non-conduction of the transistor of the gate. The gate is connected to a suitable source of operating potential which provides a predetermined current to the base of the transistor in order to drive subsequent stages. In order to have a high fan-out capability, as well as a fast speed, this current should be relatively high. However, designing the circuit for high current, also greatly increases the power dissipation, an undesirable feature especially when the gate is fabricated by integrated circuit techniques wherein the semiconductor elements are formulated on a semiconductor wafer. The unwanted and excess power dissipation can cause excessive heating tending to alter or destroy proper operation. When the transistor of the gate is off, the current is supplied through a diode to a previous stage causing a further unwanted power dissipation.

It is, therefore, a primary object of the present invention to provide an improved logic circuit.

It is another object to provide a logic circuit wherein the relative speed of operation is increased.

It is a further object to provide a logic circuit wherein current flow is substantially reduced when not needed.

Another object is to provide a DTL NAND gate operating at increased speeds yet wherein power dissipation is greatly reduced.

A further object is to provide improved gating circuits with reduced power dissipation and increased speeds, particularly well adapted to be formulated by integrated circuit methods.

Briefly, in accordance with the above objects, the broad concept of the invention comprises a logic gate having one or more input semiconductor devices each having an input electrode to which bivalued input signals are applied, and each having a like output electrode connected to a common point at which is developed bivalued signals in response to the input signals. The gate includes a pair of transistors having their base electrodes connected together and to the common point, so that the transistors concurrently turn on and off in response to the signal at the common point. A first resistor is connected to the common point and a suitable source of biasing potential to provide a first and relatively low current to a previous stage, or to the bases of the pair of transistors. An output junction to which output lead means may be attached is connected to one transistor of the pair. A third transistor is provided and is responsive to the voltage across the other transistor of the pair to provide a large surge of current to the output junction during the transition period when the pair of transistors switch from their on to their off condition. During steady state conditions this third transistor remains in an off condition.

The gate operates in a manner such that during steady state conditions a relatively low current is supplied and consequently the power dissipation is reduced. During the transient switching state, a surge of relatively high current is provided to increase the speed of operation.

The above stated, as well as other objects, features and advantages of the invention will become apparent upon a reading of the following detailed specification taken in conjunction with the drawings, in which.

Figure 1:
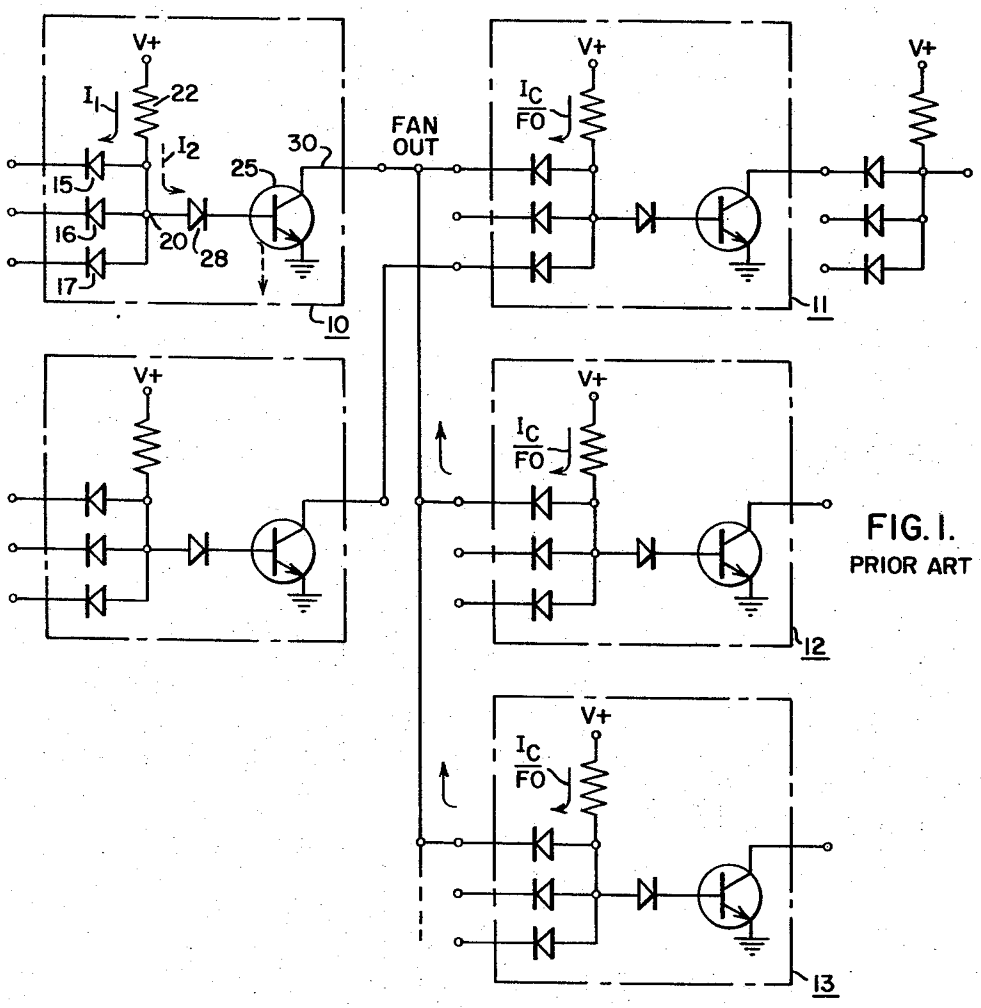
FIGURE 1 illustrates a NAND logic system of the prior art.

FIG. 1 shows a NAND gate 10, the output signal of which is fed into subsequent NAND gates 11, 12 and 13 representing a fan-out of three, although a greater fan-out could be provided depending upon the design considerations of the system.

The DTL NAND gate 10 includes a plurality of input diodes 15, 16 and 17 each having their anode electrode connected to a common point 20. Resistor 22 representing a load resistor is operably connected to a source of operating potential $V_+$. The gate 10 includes transistor 25 the base of which is connected to common point 20 through diode means 28. If a ZERO signal is presented to one of the diodes, for example, diode 15, it will conduct and the current $I_1$ flows through resistor 22 through diode 15 back to a previous stage. The voltage appearing at point 20 represents a ZERO signal and in actuality may be equal to the voltage drop across the diode and the $V_{ce}$ (collector-emitter voltage) of a transistor of a previous stage, the voltage at point 20 being in the order of 0.8 volt for silicon semiconductor devices. The 0.8 volt drop across diode 28 is insufficient to turn on transistor 25, the non-conduction thereof representing a ONE signal at the output lead 30.

When all of the input signals to gate 10 are high, diodes 15, 16 and 17 are blocked, the voltage at common point 20 rises and current $I_2$ will flow from $V_+$ through resistor 22 through the diodes 28 and will be the base current of transistor 25. Basically, the larger the base current the larger the collector current and, therefore, the greater the fan-out capabilities. Additionally, the larger current increases the switching speed of the gate. When base current flows, each of the subsequent gates 11, 12 and 13 provides a portion of the collector current of transistor 25, each portion being designated $I_c/fo$ where $I_c$ represents the collector current of transistor 25 and $fo$ represents the number of fan-outs. $I_c/fo$ current is identical to the $I_1$ current shown in gate 10. This current flowing through a respective load resistor to a previous stage represents a large waste of power. It is seen, therefore, that a situation is presented wherein for some applications a large current is desired for increasing speed and fan-out capabilities and for other applications a small current is desired for reducing power dissipation. In the present invention a NAND gate is provided which has increased speeds, but relatively low power dissipation and to this end reference should now be made to FIG. 2.

Figure 2:
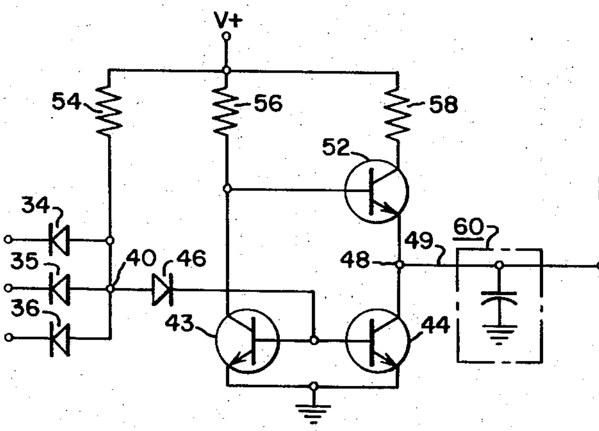
FIG. 2 illustrates an embodiment of the present invention.

FIG. 2 illustrates a NAND gate according to the teachings of the present invention. The gate includes input semiconductor devices in the form of diodes 34, 35 and 36 each having their anode electrode connected to common point 40 and each being operable to receive bivalued input signals at their cathode electrodes. Transistors 43 and 44 each has its emitter electrode connected to a point of reference potential such as ground. Transistors 43 and 44 have their base electrode connected together and are connected to the common point 40 through diode means 46 and operate concurrently to turn on and off in response to the voltage appearing at the common point 40. An output junction 48 to which output lead 49 may be connected, is electrically connected to the collector electrode of transistor 44. The voltages appearing at the output lead 49 will, in general, depend upon circuit design considerations such as voltage supplies, resistors, types of transistors utilized, and to a large extent, upon subsequent circuitry receiving the output signals. The term bivalued signals is utilized herein to mean a ZERO signal, which is ground potential or approximately 0.2 volt above ground, for silicon transistors, and the ONE signal which is the higher voltage ranging anywhere from approximately 0.6 volt to some higher voltage determined by the circuit parameters.

Although FIG. 2 will be described with respect to positive logic, the teachings of the present invention are equally applicable to negative logic by rearrangement of transistor types and by connecting the gate to a source of negative potential as is apparent to those skilled in the art.

In order to provide a large surge of current during the transition period when transistors 43 and 44 switch to their off condition, there is provided a third transistor 52 having its emitter electrode connected to the output junction 48 and its base electrode connected to the collector electrode of transistor 43.

A first predetermined current is supplied to a previous stage or to the base electrodes of transistors 43 and 44 through a first resistor 54 connected to a suitable source of operating potential $V_+$. A second resistor 56 is connected to $V_+$ and to both the base electrode of transistor 52 and collector electrode of transistor 43. A third resistor 58 connects the collector electrode of transistor 52 to $V_+$. From a relative standpoint, the value of resistors 54 and 56 are much greater than the value of resistor 58. By way of example, in a typical circuit the value of resistor 54 is 22,000 ohms, the value of resistor 56 is 5,000 ohms and the value of resistor 58 is 240 ohms. The high value of resistor 54 ensures that a relatively low current will be supplied for low power dissipation considerations, whereas a second predetermined and much larger current will be supplied by the combination of transistor 52 and low resistance 58 for speed considerations.

In order to best understand the operation of the NAND gate of FIG. 2 let it be assumed that the gate drives a plurality of subsequent stages, which may be represented by the capacitor load 60 connected to the output lead 49. The specific value of equivalent capacitance provided by the capacitor 60 will, of course, depend upon the number and nature of the subsequent fan-out stages.

The steady state conditions will first be considered. With all ONE inputs to diodes 34, 35 and 36, the voltage at common point 40 is high and the transistors 43 and 44 will be in their on or conducting condition. Base current for the transistors 43 and 44 is supplied by $V_+$ through resistor 54 and through diode 46. As was stated, due to the high value of resistor 54, this current is relatively low in order to minimize power dissipation. Collector current for transistor 43 is provided by the combination of $V_+$ and resistor 56, and this current also is of a low value to minimize power dissipation. With transistors 43 and 44 in an on stage, the voltage at the collectors thereof are at or near ground potential. Transistor 52 being responsive to the voltage at the collector at transistor 43 remains in an off condition since the voltage at the base thereof (the collector voltage of transistor 43) is of an insufficient value to turn the transistor 52 on. For silicon type transistors described herein and for the NPN transistor shown, the voltage at the base electrode has to be approximately 0.6 volt higher than the voltage at the emitter electrode. Collector current for transistor 44 flows into lead 49 from subsequent stages such as shown in FIG. 1.

With a ZERO, or low signal appearing at any of the input diodes 34, 35 or 36, the voltage at common point 40 is of a low value, transistors 43 and 44 are in their off or non-conducting condition and a relatively low value current is supplied by the combination of $V_+$ and resistor 54 back through the diode receiving the ZERO signal to a previous stage. The voltage at the collector transistor 44 is at its ONE or high value determined by the nature and value of components of subsequent stages. The circuit is designed such that the voltage at the collector of transistor 43 applied to the base electrode of transistor 52, is insufficient to turn transistor 52 to its on condition in the steady state.

It is seen, therefore, that during steady state operation no current flows through low resistor 58 or transistor 52 and the currents that do flow in response to the various combinations of signals appearing at the input diodes are of a relatively small value since resistors 54 and 56 are of a relatively high value, thus ensuring that power dissipation is kept to a minimum.

Transistor 52, and the current supplied thereby, comes into play during the transient period when the gate is in the process of switching. An an example, assume that all of the inputs to diodes 34, 35 and 36 are high and transistor 44 is in its on condition. The voltage at lead 49 is the low voltage or ZERO value, being equal to the voltage drop from the collector to ground of transistor 44. Since capacitor load 60 is connected between output lead 49 and ground, the voltage thereacross is the low voltage ZERO value. During a switching operation the voltage on output lead 49 goes to its high voltage or ONE value and consequently the voltage across capacitor load 60 changes to its ONE value. The change of charge on capacitor load 60 is a function of the capacitance, the change in voltage across the capacitor, the value of driving current and the length of time that the driving current is applied.

The equivalent value of capacitance may be determined from the nature of the subsequent circuitry. The change in voltage across the capacitor is known. It is the difference between a ZERO and a ONE value. Mathematically $\Delta Q=C\Delta V$ where ΔQ is the change of charge on the capacitor, C is the value of the capacitor and ΔV is the change in voltage across the capacitor. However, $\Delta Q=I\Delta T$ where I is the charging current and ΔT is the time required to charge the capacitor. In this relation it can be seen that with a known ΔQ the time required to charge up the capacitor (ΔT) may be reduced by increasing the amount of current I. A reduced time to charge up the capacitor means that the switching from a ZERO to a ONE value occurs at a greater speed. Transistor 52 in conjunction with resistor 58 and voltage $V_+$ supplies this relatively high value of current in order to decrease $\Delta T$, that is, in order to increase switching speeds. This operation is accomplished as follows: Assuming a time just before transition, the voltage on lead 49 is representative of a ZERO and the voltage at the base of transistor 52 maintains it in an off condition. When one or more of the output signals reverts to a ZERO, transistors 43 and 44 start switching to their off condition. As transistor 43 switches to its off condition the voltage at the collector thereof increases and is applied to the base electrode of transistor 52. The ZERO voltage across capacitor load 60 is applied to the emitter electrode of transistor 52 and the voltage condition at the base and emitter electrodes of transistor 52 is such that it will be turned on. With transistor 52 turned on, a relatively large amount of current is supplied to the output junction 48 by virtue of the low value of resistance 58, to charge up the equivalent capacitor load 60 to its ONE value. When the capacitor load 60 is charged to its ONE value aided by the large surge of current provided by transistor 52, the voltage conditions at the emitter and base electrodes thereof are such that the transistor 52 will be switched to its off condition. Thusly, it is seen that during the transient period when transistors 43 and 44 concurrently turn off to switch the ZERO output signal to a ONE output signal, a large surge of current is momentarily provided through the current path established from $V_+$ through resistor 58, through transistor 52 to charge up the equivalent capacitor load 60. In general, the higher the value of this current provided, the quicker will the capacitor load be charged up, indicative of a greatly increased speed of operation. Since the large surge of current is applied only momentarily there will be an increase power dissipation only momentarily until the circuit again reverts to its steady state condition as described previously.

The circuit of FIG. 2 has been built and includes a voltage supply $V_+$ of 2.5 volts with resistors 54, 56 and 58 having the aforementioned values of 22,000, 5,000 and 240 ohms respectively. Transistors 43, 44 and 52 were 2N708's. Three such NAND gates were connected in a ring configuration and exhibited a propagation delay time of approximately 25 nanoseconds with an average power dissipation of approximately 1 milliwatt.

Although 2N708 transistors were utilized in the breadboard circuit, the circuit of FIG. 2 is very adaptable to be fabricated by integrated circuit techniques.

Accordingly, there has been provided a NAND gate which is capable of operating at increased switching speeds while still maintaining overall low power dissipation. This is accomplished by providing a large surge of current during the transient period when the gate switches, after which during the transient conditions relatively lower currents are established in the circuit.

Although the present invention has been described with a certain degree of particularity, it should be understood that the present disclosure has been made by way of example and that modifications and variations of the present invention are made possible in the light of the above teachings.

What is claimed is:

1. A logic circuit comprising:

an input circuit for receiving, simultaneously, a plurality of bivalued input signals for developing bivalued signals at a circuit point;

first and second trasistors each having a base, collector and emitter electrode and having their base electrodes directly connected together, and their emitter electrodes connected to a point of reference potential;

a single direct connection connecting the base electrodes of said first and second transistors to said circuit point;

an output junction connected to the collector electrode of said second transistor;

first current supply means for supplying a first current to said base electrodes to turn said transistors on when said input signals all have the same first value, and to turn said transistors off when at least one of said input signals has a second value;

second current supply means responsive to the voltage at the collector electrode of said first transistor for supplying a surge of current to said output junction when said transistors turn off in response to said input signal having said second value.

2. A logic circuit comprising:

an input circuit for receiving bivalued input signals for developing bivalued signals at a circuit point;

a first and second transistor each having a base, collector and emitter electrode and having their base electrodes commonly connnected together and their emitter electrodes connected to a point of reference potential;

means connecting said circuit point with said commonly connected base electrodes;

an output junction connected to the collector electrode of said second transistor;

a third transistor having a base, collector and emitter electrode and having its base electrode connected to the collector electrode of said first transistor and emitter electrode connected to said output junction;

a first resistor connected to said common point for supplying base current to said first and second transistors;

a second resistor connected to the collector of said first, and base electrode of said third transistor;

a third resistor connected to the collector electrode of said third transistor;

output lead means connected to said output junction; and means for connecting said resistors to a source of operating potential.

3. A logic circuit according to claim 2 in which the first and second transistors have values much greater than that of the third resistor.

4. A logic circuit according to claim 2 in which the second resistor is over twenty times the value of the third resistor and the first resistor is over four times the value of the second resistor.

References Cited

UNITED STATES PATENTS

| | | | |
|---|---|---|---|
| 3,050,641 | 8/1962 | Walsh | 307—88.5 |
| 3,124,758 | 3/1964 | Bellamy et al. | 307—88.5 |
| 3,229,119 | 1/1966 | Bolin et al. | 307—88.5 |
| 3,271,590 | 9/1966 | Sturman | 307—88.5 |

OTHER REFERENCES

EPSCO Bulletin TDC-112 "Power Amplifier," November 1958.

ARTHUR GAUSS, *Primary Examiner.*

DAVID J. GALVIN, *Examiner.*

B. P. DAVIS, *Assistant Examiner.*